United States Patent
Wiersch et al.

(10) Patent No.: US 10,608,538 B1
(45) Date of Patent: Mar. 31, 2020

(54) DETECTION OF LOW OUTPUT VOLTAGES FOR POWER CONVERTERS

(71) Applicant: TEXAS INSTRUMENTS INCORPORATED, Dallas, TX (US)

(72) Inventors: Manuel Wiersch, Freising (DE); Gerhard Thiele, Dachau (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/258,320

(22) Filed: Jan. 25, 2019

(51) Int. Cl.
  *H02M 3/158* (2006.01)
  *H02M 1/08* (2006.01)
  *H03K 17/687* (2006.01)
  *H02M 3/157* (2006.01)

(52) U.S. Cl.
  CPC ........... *H02M 3/1582* (2013.01); *H02M 1/08* (2013.01); *H02M 3/1588* (2013.01); *H03K 17/6872* (2013.01); *H02M 3/157* (2013.01); *H02M 3/158* (2013.01); *H02M 3/1584* (2013.01)

(58) Field of Classification Search
  CPC .... H02M 3/1582; H02M 3/1588; H02M 1/08; H02M 3/157; H02M 3/158; H02M 3/1584; H03K 17/6872
  See application file for complete search history.

(56) References Cited

U.S. PATENT DOCUMENTS

| | | | |
|---|---|---|---|
| 8,970,199 B2* | 3/2015 | Scoones ................. | H02M 1/32 323/285 |
| 10,075,073 B2* | 9/2018 | Guan ........................ | G05F 1/46 |
| 2009/0128116 A1* | 5/2009 | Noda .................. | H02M 3/1588 323/290 |
| 2014/0043091 A1* | 2/2014 | Lee .................... | H03K 17/6872 327/408 |

* cited by examiner

*Primary Examiner* — Kyle J Moody
(74) *Attorney, Agent, or Firm* — Tuenlap Chan; Charles A. Brill; Frank D. Cimino (57) ABSTRACT

A device includes a first transistor coupled to a ground node and a current source. The first transistor includes a control terminal coupled to a reference voltage source, where the current source is coupled to an input voltage source. The device includes a second transistor coupled to the input voltage source, where the second transistor includes a control terminal coupled to the first transistor. The device includes a third transistor coupled to the second transistor, where the third transistor includes a control terminal coupled to an output voltage node. The device includes a fourth transistor coupled to the third transistor, where the fourth transistor includes a control terminal coupled to the output voltage node. The device includes a fifth transistor coupled to the fourth transistor and a resistor, where the fifth transistor includes a control terminal coupled to the fourth transistor. The resistor is coupled to the ground node.

16 Claims, 4 Drawing Sheets

DETECTION OF LOW OUTPUT VOLTAGES FOR POWER CONVERTERS

SUMMARY

In accordance with at least one example of the disclosure, a device includes a first transistor coupled to a ground node and a current source. The first transistor includes a control terminal coupled to a reference voltage source, where the current source is coupled to an input voltage source. The device includes a second transistor coupled to the input voltage source, where the second transistor includes a control terminal coupled to the first transistor. The device includes a third transistor coupled to the second transistor, where the third transistor includes a control terminal coupled to an output voltage node. The device includes a fourth transistor coupled to the third transistor, where the fourth transistor includes a control terminal coupled to the output voltage node. The device includes a fifth transistor coupled to the fourth transistor and a resistor, where the fifth transistor includes a control terminal coupled to the fourth transistor. The resistor is coupled to the ground node.

In accordance with another example of the disclosure, a device includes a first transistor coupled to a ground node, where the first transistor includes a control terminal coupled to a reference voltage source. The device also includes a second transistor coupled to the first transistor and to a first current source, where the second transistor includes a control terminal coupled to the first current source. The first current source is coupled to an input voltage source. The device also includes a third transistor coupled to the input voltage source, where the third transistor includes a control terminal coupled to the second transistor. The device also includes a fourth transistor coupled to the third transistor, where the fourth transistor includes a control terminal coupled to an output voltage node. The device also includes a fifth transistor coupled to the fourth transistor and to a second current source, where the fifth transistor includes a control terminal coupled to the output voltage node. The second current source is coupled to the ground node.

In accordance with yet another example of the disclosure, a system includes a low output voltage detection circuit, including a first transistor coupled to a ground node and a current source, where the first transistor includes a control terminal coupled to a reference voltage source. The current source is coupled to an input voltage source. The low output voltage detection circuit also includes a second transistor coupled to the input voltage source, where the second transistor includes a control terminal coupled to the first transistor. The low output voltage detection circuit also includes a third transistor coupled to the second transistor, where the third transistor includes a control terminal coupled to an output voltage node. The low output voltage detection circuit also includes a fourth transistor coupled to the third transistor, where the fourth transistor includes a control terminal coupled to the output voltage node. The low output voltage detection circuit also includes a fifth transistor coupled to the fourth transistor and a resistor, where the fifth transistor includes a control terminal coupled to the fourth transistor. The resistor is coupled to the ground node. The system also includes a digitizer having an input coupled to a node between the third and fourth transistors and having a digital output. The system further includes a switch coupled to the digital output, the switch having a first input coupled to the input voltage source, a second input coupled to the output voltage node, and an output configured to couple to the first input in response to the digital output being asserted and to couple to the second input in response to the digital output being de-asserted.

BRIEF DESCRIPTION OF THE DRAWINGS

For a detailed description of various examples, reference will now be made to the accompanying drawings in which.

DETAILED DESCRIPTION

A step-down DC-to-DC voltage converter regulates an output voltage, where the output voltage is less in value than an input voltage provided by a power source. A buck converter topology denotes a class of DC-to-DC voltage converters with switching devices to control current through an inductor (and usually also a capacitor) to regulate the output voltage. A buck converter includes a high-side switching device to couple the inductor to the power source, and a low-side switching device to provide a current path from a ground to the inductor when the high-side switching device is switched off. In some buck converters, the high-side switching device is a metal-oxide-semiconductor field-effect transistor (MOSFET), referred to as a high-side MOSFET, and the low-side device is a MOSFET, referred to as a low-side MOSFET.

In certain buck converter topologies, pulse-width modulation (PWM) is used to control the regulation of the output voltage relative to the input voltage. A PWM modulator varies the duty cycle of the high-side MOSFET and low-side MOSFET. An increased duty cycle results in a greater output voltage relative to the input voltage while a decreased duty cycle results in a lesser output voltage relative to the input voltage. Power converter light load efficiency is improved by utilizing the output voltage, rather than the input voltage, as the supply voltage for the PWM modulator and other components of a buck core, in addition to a reference system (e.g., including a bias current and reference voltage generator). If components of the buck core and/or the reference system are powered from the output voltage, then input current draw decreases depending on the duty cycle. However, if the output voltage becomes too low for any reason, the power converter should revert to using the input voltage as the supply voltage to the PWM modulator and other components of the buck core until the output voltage recovers. If the power converter does not revert to the input voltage in such a scenario, the power converter may suffer performance issues.

Examples of present disclosure are directed to a device for quickly and accurately sensing or identifying a condition in which the output voltage is too low to be used as the supply voltage for the PWM modulator and/or other components of the buck core. The device compares the output voltage to a reference voltage and, upon the output voltage dropping below a threshold relative to the reference voltage, generates a signal indicating a low output voltage condition. Both the output voltage and the reference voltage are provided to high impedance inputs of the device. With regard to the reference voltage, this avoids the issue of loading a reference voltage source, which is problematic in low-power applications, for example a sample-and-hold bandgap reference voltage source. The signal indicating a low output voltage condition is used to switch the supply voltage for the PWM modulator and/or other components of the buck core back to the input voltage, until the low output voltage condition resolves, at which point the supply voltage for the PWM modulator and/or other components of the buck core is switched back to the output voltage. Additionally, the device achieves a low quiescent current, which improves its efficiency at light loads.

Figure 1:
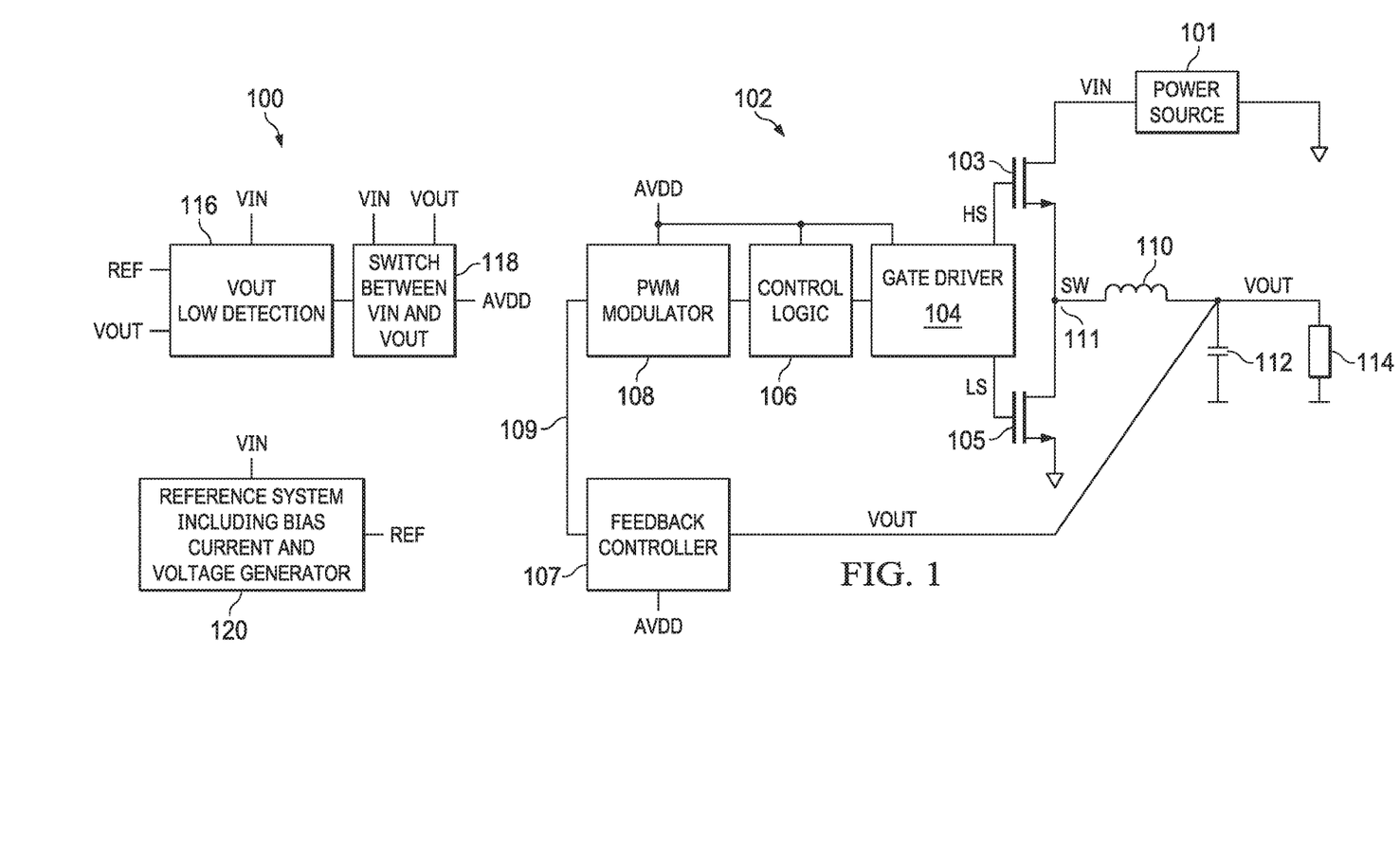
FIG. 1 shows a block diagram of a system in accordance with an example.

FIG. 1 shows an illustrative system 100 comprising a DC-to-DC voltage converter 102. In some examples, the DC-to-DC voltage converter 102 is a buck converter. The DC-to-DC voltage converter 102 comprises a high-side MOSFET 103, a low-side MOSFET 105, a gate driver 104, a controller 106, and a PWM modulator 108. The gate driver 104 includes a charge pump in some examples. The controller 106 is coupled to the high-side MOSFET 103 and the low-side MOSFET 105 by way of the gate driver 104. Some examples may include other modules (not shown) in addition to the PWM modulator 108, the controller 106, and the gate driver 104.

The high-side MOSFET 103 includes a gate, a source, and a drain. A node 111 is coupled to the source of the high-side MOSFET. The node 111 may be referred to as a switching node, and it can be a pin. The low-side MOSFET 105 also includes a gate a source, and a drain, which is coupled to the node 111.

By way of the gate driver 104, the controller 106 is coupled to a gate of the high-side MOSFET 103 to switch on and off the high-side MOSFET 103 and is coupled to a gate of the low-side MOSFET 105 to switch on and off the low-side MOSFET 105 so as to provide an output voltage (VOUT, which is also used to refer to the node at VOUT) to a load 114. The load 114 is coupled to the node 111 by way of an inductor 110 and is also coupled to a capacitor 112.

The drain of the high-side MOSFET 103 is coupled to a power source 101, which provides an input voltage (VIN, which is also used to refer to the node at VIN) as an input voltage to the DC-to-DC voltage converter 102. The source of the low-side MOSFET 105 is coupled to a ground.

The controller 106 provides to the gate driver 104 logic signals to switch on and off the high-side MOSFET 103 and the low-side MOSFET 105. The PWM modulator 108 receives a supply voltage (AVDD, which is also used to refer to the node at AVDD), which is typically either the input voltage VIN or the output voltage VOUT. The PWM modulator 108 also receives a control signal 109, which is a feedback signal derived from VOUT. For example, a feedback controller 107 receives VOUT (e.g., directly, or divided by a voltage divider, which is not shown for simplicity) as an input and, based on internal control logic, generates a corresponding control signal 109 to control the PWM modulator. The PWM modulator 108 increases or decreases the duty cycle based on the control signal 109. For example, if the control signal 109 indicates that VOUT is lower than desired, then the control signal 109 causes the PWM modulator 108 to increase the duty cycle, which is then carried out by the control logic 106 and gate driver 104 to vary the on/off times of the high-side MOSFET 103 and the low-side MOSFET 105. On the other hand, if the control signal 109 indicates that VOUT is higher than desired, then the control signal 109 causes the PWM modulator 108 to decrease the duty cycle, which is then carried out by the control logic 106 and gate driver 104 to vary the on/off times of the high-side MOSFET 103 and the low-side MOSFET 105.

Above, reference was made to a buck core, which in some examples includes the gate driver 104, the control logic 106, the PWM modulator 108, and the feedback controller 107. As explained above, efficiency of the DC-to-DC voltage converter 102 is improved when the components of the buck core such as the PWM modulator 108 are supplied by VOUT, rather than VIN. That is, efficiency is improved when AVDD is coupled to VOUT, rather than to VIN. In some examples, AVDD is only used to supply the PWM modulator 108, while in other examples AVDD is used to supply some or all of the other elements of the buck core (and the reference system 120, explained further below). The scope of the present disclosure is not limited to any component or group of components being coupled to AVDD and thus supplied by one of VIN or VOUT. For ease of discussion, the PWM modulator 108 is discussed below in this context, as it consumes a large share of current at light loads, and thus efficiency is improved when supplying the PWM modulator 108 with VOUT rather than VIN when feasible. However, other components of the buck core may also be coupled to AVDD and thus supplied by one of VIN or VOUT.

In certain situations, the PWM modulator 108 is not sufficiently supplied by VOUT, which could cause, for example, a decrease in the speed of operation of the PWM modulator 108, which is undesirable. For example, when VOUT becomes too low, VOUT may not provide adequate headroom for the operation of the PWM modulator 108. If VOUT becomes too low for any reason, then AVDD should be coupled to VIN until VOUT recovers.

To facilitate improvements to the overall efficiency of the DC-to-DC converter 102, a VOUT low detection circuit 116 is coupled to VIN, which is a supply voltage for the VOUT low detection circuit 116. The VOUT low detection circuit 116 also receives VOUT and a reference voltage (REF) as inputs. As will be explained further below, these inputs are high impedance inputs to avoid loading of either REF or VOUT. The VOUT low detection circuit 116 compares VOUT to REF and, based on a result of that comparison, generates a VOUT_LOW signal. The VOUT_LOW signal may comprise a digital signal that is either asserted or de-asserted.

As one example of the comparison between VOUT and REF performed by the VOUT low detection circuit 116, REF comprises a reference voltage equal to the target value of VOUT, for example 1.5V. A reference system 120 generates REF (as well as a bias current, described further below), which may be derived by amplifying or attenuating an internal reference voltage (not shown) to the target output voltage. For example, the internal reference voltage may comprise a bandgap voltage, which is amplified to the target level for VOUT (e.g., 1.5V) and stored on a sample-and-hold capacitance. While a sample-and-hold bandgap reference is well-suited for reducing power consumption (e.g., for ultra-low power applications), such a reference should not be loaded, and thus should be coupled to a high impedance input.

In the above example, since REF is set to the target value of VOUT, VOUT is not directly compared to REF since even a small reduction in VOUT would cause assertion of VOUT_LOW. Thus, the VOUT low detection circuit 116 establishes a threshold value relative to REF that, as a result of VOUT dropping below REF minus the threshold value, causes the VOUT low detection circuit 116 to assert VOUT_LOW. For example, the threshold may be 300 mV, and thus VOUT_LOW is asserted when VOUT drops below 1.2V. Subsequently, when VOUT recovers above 1.2 volts, VOUT_LOW is de-asserted.

The VOUT_LOW signal is represented in FIG. 1 by the coupling of the VOUT low detection circuit 116 to a switch 118. The switch 118 receives VIN and VOUT as inputs, and provides AVDD to the PWM modulator 108. As a result of VOUT_LOW being asserted, indicating that VOUT is lower than required to supply the PWM modulator 108, the switch 118 couples VIN to AVDD. Similarly, as a result of VOUT_LOW being de-asserted, indicating that VOUT is sufficient to supply the PWM modulator 108, the switch 118 couples VOUT to AVDD. As will be explained in further detail below, the VOUT low detection circuit 116 avoids loading the reference voltage REF, as it is a high impedance input to the VOUT low detection circuit. Further, the VOUT low detection circuit 116 detects a falling VOUT quickly, and thus causes the switch to supply the PWM modulator 108 with VIN, to avoid impeding the performance of the PWM modulator 108. Finally, the VOUT low detection circuit 116 has a sufficiently low quiescent current, such that the efficiency benefit of supplying the PWM modulator 108 with VOUT is maintained.

Figure 2:
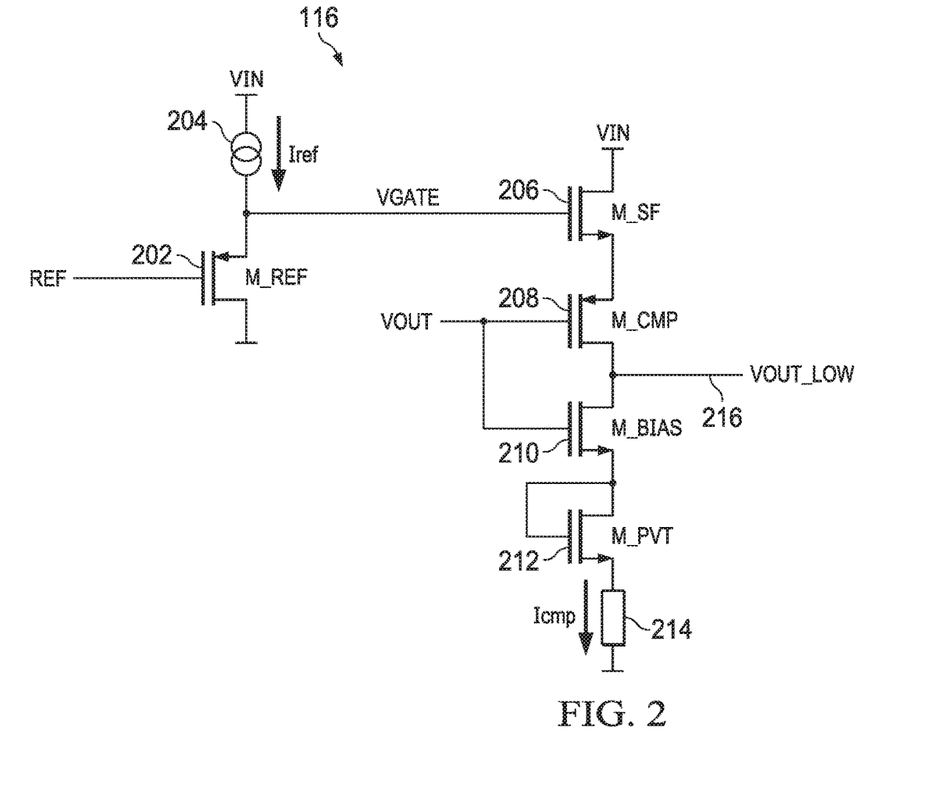
FIG. 2 shows a circuit schematic diagram in accordance with an example.

FIG. 2 shows a circuit schematic diagram of the VOUT low detection circuit 116 in accordance with various examples of this disclosure. The VOUT low detection circuit 116 includes a p-type MOSFET 202 comprising a gate, a source, and a drain. The gate of the p-type MOSFET 202 is coupled to REF (e.g., from the reference system 120 of FIG. 1), and thus serves as a high impedance input for REF. The drain of the p-type MOSFET 202 is coupled to a ground.

The VOUT low detection circuit 116 also includes a current source 204 that provides a reference current (Iref) and an n-type MOSFET 206, which comprises a gate, a source, and a drain. The n-type MOSFET 206 is, for example, a natural transistor. The source of the p-type MOSFET 202 is coupled to the current source 204 and to the gate of the n-type MOSFET 206, the voltage of which is VGATE. VIN serves as the supply voltage for the VOUT low detection circuit 116, as explained above, and is coupled to the current source 204 and to the drain of the n-type MOSFET 206.

The VOUT low detection circuit 116 further includes a p-type MOSFET 208 and n-type MOSFETs 210, 212, each of which comprises a gate, a source, and a drain. The n-type MOSFET 212 is, for example, a natural transistor. In other examples, the n-type MOSFETs 206, 212 comprise a low-VTH transistor (e.g., VTH of approximately 150 mV) while in yet other examples the n-type MOSFETs 206, 212 comprise a high-VTH transistor (e.g., VTH of approximately 600 mV). The source of the n-type MOSFET 206 described above is coupled to the source of the p-type MOSFET 208, while the drain of the p-type MOSFET 208 is coupled to the drain of the n-type MOSFET 210, and forms the node 216, which provides VOUT_LOW. The gates of both the p-type MOSFET 208 and the n-type MOSFET 210 are coupled to VOUT, and thus serve as a high impedance input for VOUT. The source of the n-type MOSFET 210 is coupled to the drain and gate of the n-type MOSFET 212. The source of the n-type MOSFET 212 is coupled to a resistor 214, which in turn is coupled to a ground. A current through the resistor 214 is notated Icmp. In the example of FIG. 2, VOUT_LOW is an analog signal; however, VOUT_LOW may be converted to a digital signal (e.g., by a Schmitt trigger) before being provided to the switch 118, explained above.

The function of the exemplary VOUT low detection circuit 116 of FIG. 2 is described with reference to the waveforms 300 of FIG. 3. The REF, VOUT, VGATE, Iref, and Icmp waveforms correspond to the values introduced above. The V_M_SF_S waveform corresponds to the source voltage of the n-type MOSFET 206, which is a source follower. The V_M_BIAS_S waveform corresponds to the source voltage of the n-type MOSFET 210. The V_M_PVT_S waveform corresponds to the source voltage of the n-type MOSFET 212, which compensates for the process parameters of the n-type MOSFET 206. The VOUT_LOW waveform corresponds to the analog voltage at the node 216, while the VOUT_LOW_D waveform corresponds to a digitized version of the VOUT_LOW signal. For example, a Schmitt trigger receives the analog VOUT_LOW as an input and generates the digital VOUT_LOW_D as an output.

Additionally, VGS is the gate-source voltage of a device. VTH is the threshold voltage of a device. VOV is the overdrive voltage of a device (VOV=VGS−VTH) and increases as current through the device increases. A voltage followed by a reference numeral refers to that voltage of the referred-to device (e.g., VGS202 refers to the gate-source voltage of the p-type MOSFET 202). Further, certain assumptions are made for the ease of facilitating discussion below, but that are not limitations on the scope of the disclosed examples. For example, it is assumed that the devices are in weak inversion (where drain current has an exponential dependency on VGS), and a nominal value of Icmp is approximately 100 times Iref. It is also assumed that the subthreshold slope for the devices of FIG. 2 is approximately 90 mV/decade. It is further assumed that the p-type MOSFETs 202 and 208 are the same device type and thus their VTH cancels. It is also assumed that the n-type MOSFETs 206 and 212 are the same device type.

For the purposes of this example, it is assumed that REF is 1.5V while the additional threshold imposed by the VOUT low detection circuit 116 is 350 mV. That is, VOUT_LOW_D should be asserted when VOUT falls below approximately 1.15V.

The VOUT low detection circuit 116 of FIG. 2 trip point (e.g., the point at which VOUT_LOW is asserted) is calculated as follows.

VGATE=REF+VTH202+VOV202

VM_SF_S=VGATE−(VTH206+VOV206); or

VM_SF_S=REF+VTH202+VOV202−(VTH206+VOV206)

In order to assert VOUT_LOW, and thus VOUT_LOW_D:

VOUT<V_M_SF_S−(VTH208+VOV208), or

VOUT<REF+VTH202+VOV202−(VTH206+VOV206)−(VTH208+VOV208)

As explained above, VTH202 and VTH208 cancel, which results in

VOUT<REF+(VOV202−VOV208)−(VTH206+VOV206)

As a result of VTH206 remaining in the VOUT trip point determination, there is a process dependency introduced by the n-type MOSFET 206. Considering the above assumptions that the subthreshold slope of the devices is 90 mV/decade and Icmp is 100 times Iref:

VOV202−VOV208=−180 mV.

Further, VTH206+VOV206=VGS206, which is 170 mV in an example where the n-type MOSFET 206 is a natural transistor and thus VTH206=−10 mV. As a result, in this example, the VOUT trip point occurs when VOUT<1.5V− 180 mV−170 mV=1.15V. In other words, VOUT_LOW goes high, and thus VOUT_LOW_D is asserted, when VOUT drops below 1.15V. The n-type MOSFET 212 reduces the process dependency of the n-type MOSFET 206, since a higher VTH206 reduces Icmp, which in turn reduces VOV206 and thus variation on the quantity VTH206+ VOV206, used to calculate the VOUT trip point above. In another example, the n-type MOSFETs 210, 212 may be removed from the circuit 116, although with an effect on process, temperature, and input voltage variation. In yet another example, a current source replaces the resistor 214 coupled to the source of the n-type MOSFET 212.

Initially, VOUT and VREF are both 1.5V, and thus the voltages applied to the gates of the p-type MOSFETs 202 and 208 are the same. In this example, since the p-type MOSFETs 202, 208 are the same device type and equally sized, then the current through the p-type MOSFETs 202, 208 is in the same range as Iref. The n-type MOSFET 210 sets the bias current Icmp as follows:

Icmp=(VOUT−VGS210−VGS212)/R

VOUT_LOW remains low as long as the current through the p-type MOSFET 208 is lower than Icmp. The n-type MOSFET 212 is used to reduce the process and temperature variation of the n-type MOSFET 206. As a result of VOUT_LOW being low, VOUT_LOW_D remains de-asserted, and thus the switch 118 couples VOUT to AVDD to supply the PWM modulator 108. The current drawn by the VOUT low detection circuit 116 in this configuration is limited to Iref, which in this example is approximately 1 nA. In examples, this is an acceptable tradeoff for the efficiency gained by supplying the PWM modulator 108 with VOUT rather than VIN.

As VOUT decreases, the drain current of the p-type MOSFET 208 increases while the n-type MOSFET 206 acting as a source follower maintains its source (and the source of the p-type MOSFET 208) within VGS206 of VGATE. In addition, the source voltage of the n-type MOSFET 210 decreases, resulting in a lower voltage across the resistor 214, which in turn reduces the bias current Icmp. Once the current through the p-type MOSFET 208 is greater than Icmp, voltage at the node 216 corresponding to VOUT LOW will increase.

The n-type MOSFET 206 maintains its source at VGATE−VGS206. Thus, as VOUT approaches 1.15V, derived from the equations and assumptions outlined above, Icmp continues to increase. Once VOUT crosses below the 1.15V threshold at the time 302, the p-type MOSFET 208 is fully on, and VOUT_LOW is pulled to the source voltage of the n-type MOSFET 206, or approximately 1.4V in this example. At the same time, the sources of both the n-type MOSFETs 210, 212 are limited by the decreasing value of VOUT and their respective VGS values.

As explained above, VOUT_LOW is an analog voltage. However, VOUT_LOW may be provided to a digitizer such as a Schmitt trigger as an input, and thus when VOUT_LOW crosses above a certain threshold, the output of the Schmitt trigger is asserted. The VOUT_LOW_D waveform reflects the digital signal output of the exemplary Schmitt trigger, which is provided to the switch 118 causing the switch 118 to couple VIN to AVDD to supply the PWM modulator.

As VOUT continues to fall beyond the threshold discussed above, Icmp begins to be limited by, for example, the decreasing gate voltage of the n-type MOSFET 210. This is seen as a roughly linear decline in Icmp after the time 302. Since the maximum value of Icmp is limited by (VOUT− VGS210−VGS212)/R, the point at which the VOUT drop causes current through the p-type MOSFET 208 to exceed the maximum value of Icmp corresponds with VOUT_LOW being pulled up. Thus, as VOUT decreases further, Icmp linearly decreases as well.

Figure 3:
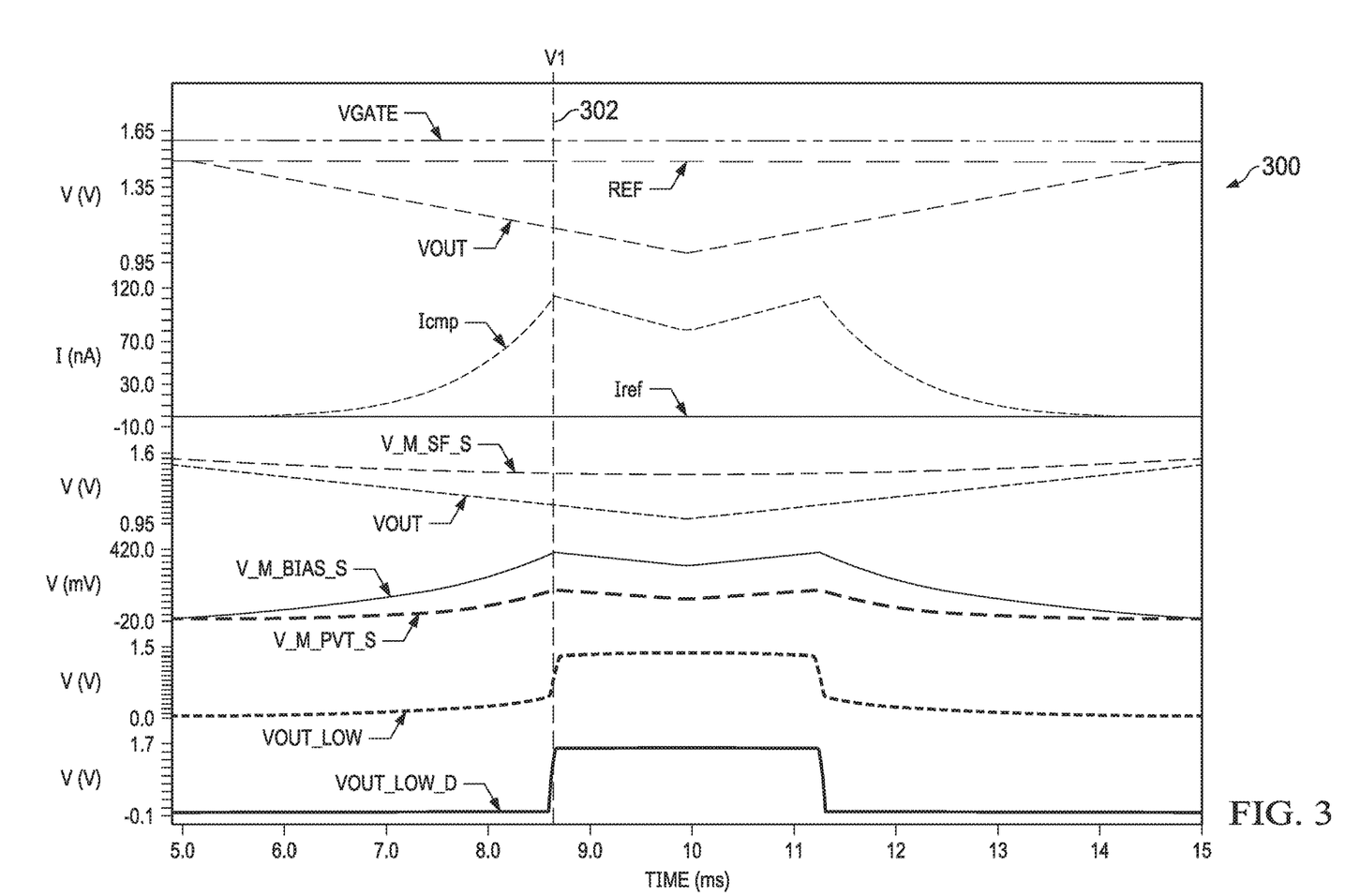
FIG. 3 shows waveforms corresponding to the circuit of FIG. 2 in accordance with an example.

FIG. 3 also demonstrates the behavior of the VOUT low detection circuit 116 as VOUT increases past the threshold, which is essentially a mirror image of the behavior described above.

Although the decline and incline of VOUT shown in FIG. 3 and described above is gradual, in some examples a short is developed at the load 114, causing VOUT to sharply fall to 0V. In this example, the n-type MOSFET 210 acts as a fast detection transistor, since it will turn fully off with a gate voltage of 0V. At the same time, the p-type MOSFET 208 will turn fully on, and VOUT_LOW will quickly rise to the source voltage of the n-type MOSFET 206. As above, this causes VOUT_LOW_D to be asserted, which in turn causes the switch 118 to couple VIN to AVDD to supply the PWM modulator 108. Upon resolution of the short, and restoration of VOUT, VOUT_LOW is pulled back to ground as above. As a result, VOUT_LOW_D is de-asserted, which in turn causes the switch 118 to couple VOUT to AVDD to supply the PWM modulator 108, increasing the efficiency of the DC-to-DC converter 102.

As explained above, in some examples both the n-type MOSFET 206 and the n-type MOSFET 212 comprise natural transistors. The n-type MOSFET 206 being a natural transistor allows for more headroom to adjust the threshold that, when VOUT drops below, will cause VOUT_LOW to be pulled to the source voltage of the n-type MOSFET 206. That is, the VTH of a natural transistor is quite low, whereas a higher VTH leads to a lower voltage at the source of the n-type MOSFET 206, which results in a lower voltage to detect that VOUT has fallen too low or requires a higher input voltage to maintain. Further, natural transistors exhibit less process variation of their threshold voltages, which is beneficial in this example because it provides a more accurate trip point for VOUT across process variations, which increases the overall efficiency of the DC-to-DC converter 102 when supplying AVDD with VOUT.

Figure 4:
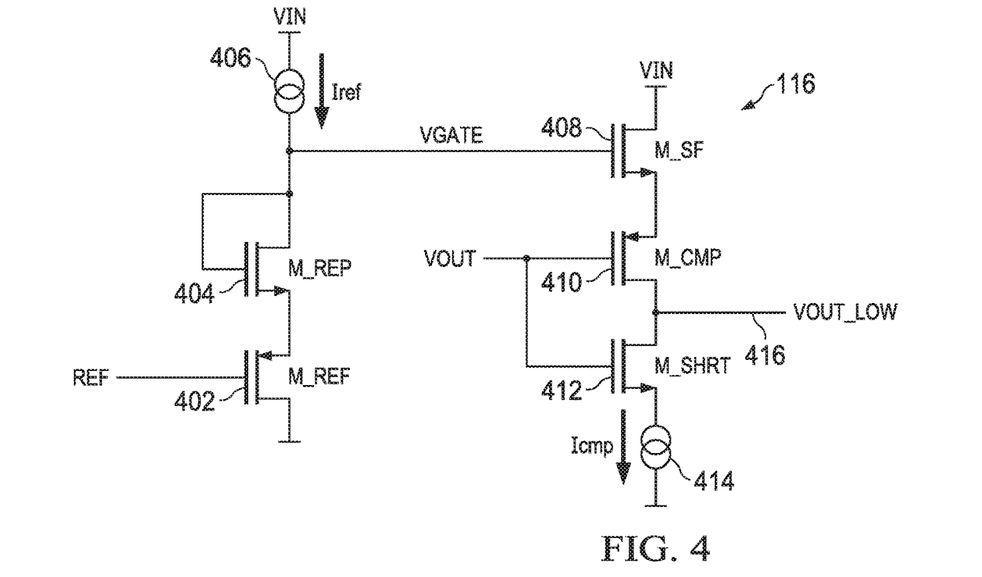
FIG. 4 shows another circuit schematic diagram in accordance with an example.

FIG. 4 shows another circuit schematic diagram of the VOUT low detection circuit 116 in accordance with various examples of this disclosure. Whereas the example of FIG. 2 demonstrated a process dependency on VTH of the n-type MOSFET 206 (VTH206 remained in the VOUT trip point determination), the example circuit of FIG. 4 reduces such dependencies.

The VOUT low detection circuit 116 includes a p-type MOSFET 402 comprising a gate, a source, and a drain. The gate of the p-type MOSFET 402 is coupled to REF (e.g., from the reference system 120 of FIG. 1), and thus serves as a high impedance input for REF. The drain of the p-type MOSFET 402 is coupled to a ground. The VOUT low detection circuit 116 also includes an n-type MOSFET 404 comprising a gate coupled to its drain and a source coupled to the source of the p-type MOSFET 402. The n-type MOSFET 404 is, for example, a natural transistor.

The VOUT low detection circuit 116 also includes a current source 406 that provides a reference current (Iref) and an n-type MOSFET 408, which comprises a gate, a source, and a drain. The n-type MOSFET 408 is, for example, a natural transistor. In other examples, the n-type MOSFETs 404, 408 comprise a low-VTH transistor (e.g., 150 mV) while in yet other examples the n-type MOSFETs 404, 408 comprise a high-VTH transistor (e.g., 600 mV). The drain of the n-type MOSFET 404 is coupled to the current source 406 and to the gate of the n-type MOSFET 408, the voltage of which is VGATE. VIN serves as the supply voltage for the VOUT low detection circuit 116, as explained above, and is coupled to the current source 406 and to the drain of the n-type MOSFET 408.

The VOUT low detection circuit 116 further includes a p-type MOSFET 410 and an n-type MOSFETs 412, each of which comprises a gate, a source, and a drain. The source of the n-type MOSFET 408 described above is coupled to the source of the p-type MOSFET 410, while the drain of the p-type MOSFET 410 is coupled to the drain of the n-type MOSFET 412, and forms the node 416, which provides VOUT_LOW. The gates of both the p-type MOSFET 410 and the n-type MOSFET 412 are coupled to VOUT, and thus serve as a high impedance input for VOUT. The source of the n-type MOSFET 412 is coupled to a current source 414 that provides a bias current (Icmp). The current source 414 is also coupled to a ground. In the example of FIG. 4, VOUT_LOW is an analog signal; however, VOUT_LOW may be converted to a digital signal (e.g., by a Schmitt trigger) before being provided to the switch 118, explained above. In another example, the n-type MOSFET 412 is removed and the current source 414 is replaced with a resistor, although with an effect on process, temperature, and input voltage variation.

Figure 5:
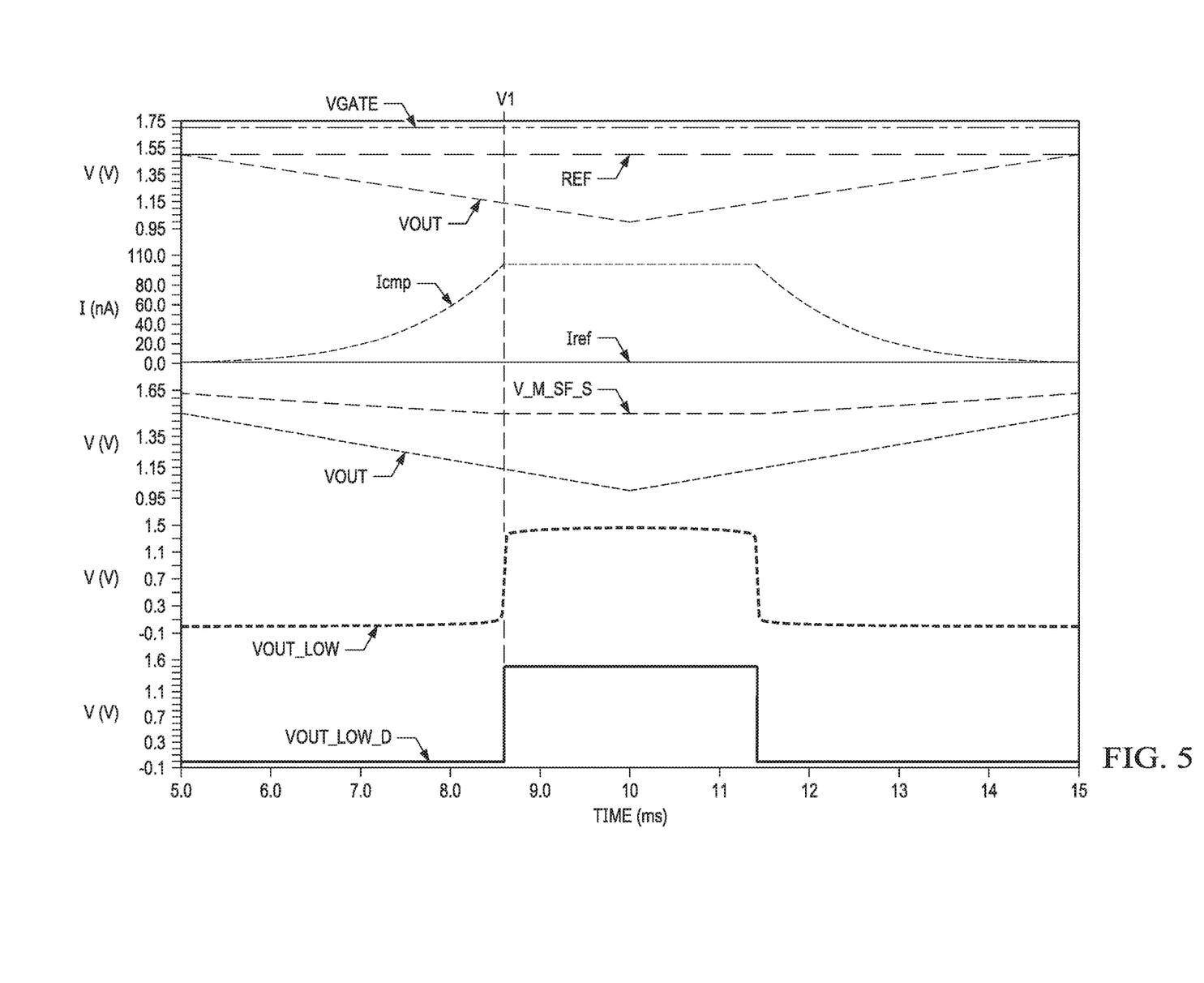
FIG. 5 shows waveforms corresponding to the circuit of FIG. 4 in accordance with an example.

The function of the exemplary VOUT low detection circuit 116 of FIG. 4 is described with reference to the waveforms 500 of FIG. 5. For example, the REF, VOUT, VGATE, Iref, and Icmp waveforms correspond to the values introduced above. Further, the V_M_SF_S waveform corresponds to the source voltage of the n-type MOSFET 408, which is a source follower. The VOUT_LOW waveform corresponds to the analog voltage at the node 416, while the VOUT_LOW_D waveform corresponds to a digitized version of the VOUT_LOW signal. For example, a Schmitt trigger receives the analog VOUT_LOW as an input and generates the digital VOUT_LOW_D as an output.

As with respect to FIG. 2, it is assumed that the devices are in weak inversion (where drain current has an exponential dependency on VGS), and a nominal value of Icmp is approximately 100 times Iref. It is also assumed that the subthreshold slope for the devices of FIG. 4 is approximately 90 mV/decade. It is further assumed that the p-type MOSFETs 402 and 410 are the same device type and thus their VTH cancels. It is also assumed that the n-type MOSFETs 404 and 408 are the same device type and thus their VTH cancels.

For the purposes of this example, it is assumed that REF is 1.5V while the additional threshold imposed by the VOUT low detection circuit 116 is 360 mV. That is, VOUT_LOW_D should be asserted when VOUT falls below approximately 1.14V.

The VOUT low detection circuit 116 of FIG. 4 trip point (e.g., the point at which VOUT_LOW is asserted) is calculated as follows.

VGATE=REF+VTH402+VOV402+VTH404+VOV404

V_M_SF_S=VGATE−(VTH408+VOV408); or

V_M_SF_S=REF+VTH402+VOV402+VTH404+VOV404−(VTH408+VOV408)

In order to assert VOUT_LOW, and thus VOUT_LOW_D:

VOUT<V_M_SF_S−(VTH410+VOV410), or

VOUT<REF+VTH402+VOV402+VTH404+VOV404−(VTH408+VOV408)−(VTH410+VOV410)

As explained above, VTH402 and VTH410 cancel, as do VTH404 and VTH408, which results in

VOUT<REF+(VOV402−VOV410)+(VOV404−VOV408)

Unlike FIG. 2, in which a VTH remained in the VOUT trip point determination, in the example of FIG. 4 no VTH remains, which eliminates the process dependency on the n-type MOSFET 408. Considering the above assumptions that the subthreshold slope of the devices is 90 mV/decade and Icmp is 100 times Iref:

VOV402−VOV410=−180 mV; and

VOV404−VOV408=−180 mV

As a result, in this example, the VOUT trip point occurs when VOUT<1.5V−180 mV−180 mV=1.14V. In other words, VOUT_LOW goes high, and thus VOUT_LOW_D is asserted, when VOUT drops below 1.14V.

Initially, VOUT and VREF are both 1.5V, and thus the voltages applied to the gates of the p-type MOSFETs 402 and 410 are the same. In this example, since the p-type MOSFETs 402, 410 are the same device type and equally sized, then the current through the p-type MOSFETs 202, 208 is in the same range as Iref.

VOUT_LOW remains low as long as the current through the p-type MOSFET 208 is lower than Icmp. As a result of VOUT_LOW being low, VOUT_LOW_D remains de-asserted, and thus the switch 118 couples VOUT to AVDD to supply the PWM modulator 108. The current drawn by the VOUT low detection circuit 116 in this configuration is limited to Iref+Icmp. In this example it is assumed that the current Icmp can never be higher than the current through the p-type MOSFET 410 and that the current source 414 is disconnected once the n-type MOSFET 412 cannot source the current Icmp anymore. These assumptions describe the behavior of a MOSFET acting as a current source. The current drawn by the VOUT low detection circuit 116 in this configuration and with these assumptions is limited to 2*Iref, which in this example is approximately 2 nA. In examples, this is an acceptable tradeoff for the efficiency gained by supplying the PWM modulator 108 with VOUT rather than VIN.

As VOUT decreases, the drain current of the p-type MOSFET 410 increases while the n-type MOSFET 408 acting as a source follower maintains its source (and the source of the p-type MOSFET 410) within VGS408 of VGATE. Once the current through the p-type MOSFET 410 is greater than Icmp, voltage at the node 416 corresponding to VOUT_LOW will increase. Once VOUT decreases far below VTH412, then the current source 414 is disconnected speeding up the detection of a short at the output.

The n-type MOSFET 408 maintains its source at VGATE−VGS408. Thus, as VOUT approaches 1.14V, derived from the equations and assumptions outlined above, Icmp continues to increase. Once VOUT crosses below the 1.14V threshold at the time 302, the p-type MOSFET 410 is fully on, and VOUT_LOW is pulled to the source voltage of the n-type MOSFET 408, or approximately 1.4V in this example. At the same time, the source of the n-type MOSFET 410 is limited by the decreasing value of VOUT and its VGS value.

As explained above, VOUT_LOW is an analog voltage. However, VOUT_LOW may be provided to a digitizer such as a Schmitt trigger as an input, and thus when VOUT_LOW crosses above a certain threshold, the output of the Schmitt trigger is asserted. The VOUT_LOW_D waveform reflects the digital signal output of the exemplary Schmitt trigger, which is provided to the switch 118 causing the switch 118 to couple VIN to AVDD to supply the PWM modulator.

As above with respect to FIG. 2, in some examples a short is developed at the load 114, causing VOUT to sharply fall to 0V. In this example, the n-type MOSFET 412 acts as a fast detection transistor, since it will turn fully off with a gate voltage of 0V. At the same time, the p-type MOSFET 410 will turn fully on, and VOUT_LOW will quickly rise to the source voltage of the n-type MOSFET 408. As above, this causes VOUT_LOW_D to be asserted, which in turn causes the switch 118 to couple VIN to AVDD to supply the PWM modulator 108. Upon resolution of the short, and restoration of VOUT, VOUT_LOW is pulled back to ground as above. As a result, VOUT_LOW_D is de-asserted, which in turn causes the switch 118 to couple VOUT to AVDD to supply the PWM modulator 108, increasing the efficiency of the DC-to-DC converter 102.

As explained above, in some examples both the n-type MOSFET 408 and the n-type MOSFET 404 comprise natural transistors. The n-type MOSFET 408 being a natural transistor allows for more headroom to adjust the threshold that, when VOUT drops below, will cause VOUT_LOW to be pulled to the source voltage of the n-type MOSFET 408. That is, the VTH of a natural transistor is quite low, whereas a higher VTH leads to a lower voltage at the source of the n-type MOSFET 408, which results in a lower voltage to detect that VOUT has fallen too low or requires a higher input voltage to maintain.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
   a first transistor coupled to a ground node and a current source, the first transistor comprising a control terminal coupled to a reference voltage source, wherein the current source is coupled to an input voltage source;
   a second transistor coupled to the input voltage source, the second transistor comprising a control terminal coupled to the first transistor;
   a third transistor coupled to the second transistor, the third transistor comprising a control terminal coupled to an output voltage node;
   a fourth transistor coupled to the third transistor, the fourth transistor comprising a control terminal coupled to the output voltage node; and
   a fifth transistor coupled to the fourth transistor and a resistor, the fifth transistor comprising a control terminal coupled to the fourth transistor, wherein the resistor is coupled to the ground node.

2. The device of claim 1 wherein a node between the third and fourth transistors comprises a low output voltage indicator.

3. The device of claim 1, wherein the second and fifth transistors comprise natural transistors.

4. The device of claim 1, wherein:
   the first and third transistors comprise p-type metal-oxide-semiconductor field-effect transistors (MOSFETs) each comprising a gate, a source, and a drain; and
   the second, fourth, and fifth transistors comprise n-type MOSFETs each comprising a gate, a source, and a drain.

5. The device of claim 4, wherein:
   the first transistor gate is coupled to the reference voltage source, the first transistor drain is coupled to the ground node, and the first transistor source is coupled to the current source and to the gate of the second transistor;
   the second transistor drain is coupled to the input voltage source and the second transistor source is coupled to the third transistor source;
   the third transistor gate is coupled to the output voltage node and the third transistor drain is coupled to the fourth transistor drain;
   the fourth transistor gate is coupled to the output voltage node and the fourth transistor source is coupled to the fifth transistor drain and gate; and
   the fifth transistor source is coupled to the resistor.

6. A device, comprising:
   a first transistor coupled to a ground node, the first transistor comprising a control terminal coupled to a reference voltage source;
   a second transistor coupled to the first transistor and to a first current source, the second transistor comprising a control terminal coupled to the first current source, wherein the first current source is coupled to an input voltage source;
   a third transistor coupled to the input voltage source, the third transistor comprising a control terminal coupled to the second transistor;
   a fourth transistor coupled to the third transistor, the fourth transistor comprising a control terminal coupled to an output voltage node; and
   a fifth transistor coupled to the fourth transistor and to a second current source, the fifth transistor comprising a control terminal coupled to the output voltage node, wherein the second current source is coupled to the ground node.

7. The device of claim 6, wherein a node between the fourth and fifth transistors comprises a low output voltage indicator.

8. The device of claim 6, wherein the second and third transistors comprise natural transistors.

9. The device of claim 6, wherein:
the first and fourth transistors comprise p-type metal-oxide-semiconductor field-effect transistors (MOSFETs) each comprising a gate, a source, and a drain; and
the second, third, and fifth transistors comprise n-type MOSFETs each comprising a gate, a source, and a drain.

10. The device of claim 9, wherein:
the first transistor gate is coupled to the reference voltage source, the first transistor drain is coupled to the ground node, and the first transistor source is coupled to the second transistor source;
the second transistor drain is coupled to the second transistor gate, the first current source, and the third transistor gate
the third transistor drain is coupled to the input voltage source and the third transistor source is coupled to the fourth transistor source;
the fourth transistor gate is coupled to the output voltage node and the fourth transistor drain is coupled to the fifth transistor drain; and
the fifth transistor gate is coupled to the output voltage node and the fifth transistor source is coupled to the second current source.

11. A system, comprising:
a low output voltage detection circuit, comprising:
a first transistor coupled to a ground node and a current source, the first transistor comprising a control terminal coupled to a reference voltage source, wherein the current source is coupled to an input voltage source;
a second transistor coupled to the input voltage source, the second transistor comprising a control terminal coupled to the first transistor;
a third transistor coupled to the second transistor, the third transistor comprising a control terminal coupled to an output voltage node;
a fourth transistor coupled to the third transistor, the fourth transistor comprising a control terminal coupled to the output voltage node; and
a fifth transistor coupled to the fourth transistor and a resistor, the fifth transistor comprising a control terminal coupled to the fourth transistor, wherein the resistor is coupled to the ground node;
a digitizer comprising an input coupled to a node between the third and fourth transistors and comprising a digital output; and
a switch coupled to the digital output, the switch comprising:
a first input coupled to the input voltage source;
a second input coupled to the output voltage node; and
an output configured to couple to the first input in response to the digital output being asserted and to couple to the second input in response to the digital output being de-asserted.

12. The system of claim 11, wherein the output of the switch is configured to couple to a buck core of a power converter.

13. The system of claim 12, wherein the output of the switch is configured to couple to a pulse-width modulation modulator of the power converter.

14. The system of claim 11, wherein the second and fifth transistors comprise natural transistors.

15. The system of claim 11, wherein:
the first and third transistors comprise p-type metal-oxide-semiconductor field-effect transistors (MOSFETs) each comprising a gate, a source, and a drain; and
the second, fourth, and fifth transistors comprise n-type MOSFETs each comprising a gate, a source, and a drain.

16. The system of claim 15, wherein:
the first transistor gate is coupled to the reference voltage source, the first transistor drain is coupled to the ground node, and the first transistor source is coupled to the current source and to the gate of the second transistor;
the second transistor drain is coupled to the input voltage source and the second transistor source is coupled to the third transistor source;
the third transistor gate is coupled to the output voltage node and the third transistor drain is coupled to the fourth transistor drain;
the fourth transistor gate is coupled to the output voltage node and the fourth transistor source is coupled to the fifth transistor drain and gate; and
the fifth transistor source is coupled to the resistor.

* * * * *